(12) United States Patent
Moon

(10) Patent No.: US 7,705,363 B2
(45) Date of Patent: Apr. 27, 2010

(54) LIGHT EMITTING DEVICE HAVING A LIGHT EXTRACTION STRUCTURE

(75) Inventor: Yong-Tae Moon, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 222 days.

(21) Appl. No.: 11/934,433

(22) Filed: Nov. 2, 2007

(65) Prior Publication Data

US 2008/0135856 A1 Jun. 12, 2008

(30) Foreign Application Priority Data

Nov. 3, 2006 (KR) ...................... 10-2006-0108217

(51) Int. Cl.
*H01L 33/00* (2010.01)
(52) U.S. Cl. ........... 257/94; 257/E33.005; 257/E33.064
(58) Field of Classification Search .................. 257/79, 257/94, E33.005, E33.006, E33.064
See application file for complete search history.

(56) References Cited

U.S. PATENT DOCUMENTS

| 6,869,820 B2 | 3/2005 | Chen et al. |
| 2006/0056474 A1* | 3/2006 | Fujimoto et al. ......... 372/43.01 |
| 2006/0273324 A1* | 12/2006 | Asai et al. ..................... 257/79 |

FOREIGN PATENT DOCUMENTS

WO    WO 2005011007 A1 *  2/2005

* cited by examiner

*Primary Examiner*—Thomas L Dickey
(74) *Attorney, Agent, or Firm*—Birch, Stewart, Kolasch & Birch, LLP

(57) ABSTRACT

A light emitting device having a vertical topology, which is capable of achieving an enhancement in light emission efficiency and reliability, and a method for manufacturing the same are disclosed. The light emitting device includes a first-conductivity-type semiconductor layer, a light emitting layer arranged over the first-conductivity-type semiconductor layer, and a second-conductivity-type semiconductor layer arranged on the light emitting layer. The second-conductivity-type semiconductor layer includes an etch barrier layer.

18 Claims, 9 Drawing Sheets

LIGHT EMITTING DEVICE HAVING A LIGHT EXTRACTION STRUCTURE

This application claims the benefit of Korean Patent Application No. 10-2006-0108217, filed on Nov. 3, 2006, which is hereby incorporated by reference as if fully set forth herein.

BACKGROUND OF THE INVENTION

1. Field of the Invention

The present invention relates to a light emitting device having a vertical topology and a method for manufacturing the same, and more particularly, to a light emitting device having a vertical topology which is capable of achieving an enhancement in light emission efficiency and reliability, and a method for manufacturing the same.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP: N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

A gallium nitride (GaN) compound semiconductor has been highlighted in the field of high-power electronic devices because it exhibits a high thermal stability and a wide band gap of 0.8 to 6.2 eV.

One of the reasons why the CaN compound semiconductor has been highlighted is that it is possible to fabricate a semiconductor layer capable of emitting green, blue, or white light, using GaN in combination with other elements, for example, indium (In), aluminum (Al), etc.

That is, it is possible to adjust the wavelength of light to be emitted, using GaN in combination with other appropriate elements. In other words, where GaN is used, it is possible to appropriately determine the material of the LCD in accordance with the characteristics of the apparatus to which the LCD is applied. For example, it is possible to fabricate a blue LED useful for optical recording or a white LED to replace a glow lamp.

By virtue of the above-mentioned advantages of the GaN based material, techniques associated with GaN-based electro-optic devices have rapidly developed since the CaN-based LEDs became commercially available in 1994.

The brightness or output of an LED manufactured using the above-mentioned GaN-based material mainly depends on the structure of an active layer, the extraction efficiency associated with external extraction of light, the size of the LED chip, the kind and angle of a mold used to assemble a lamp package, the fluorescent material used, etc.

SUMMARY OF THE INVENTION

Accordingly, the present invention is directed to a light emitting device having a vertical topology and a method for manufacturing the same that substantially obviate one or more problems due to limitations and disadvantages of the related art.

An object of the present invention is to provide a light emitting device having a vertical topology which can be formed with a light extraction structure having a uniform depth, to achieve an enhancement in the efficiency and reliability of the device, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device having a vertical topology comprises: a first-conductivity-type semiconductor layer; a light emitting layer arranged over the first-conductivity type semiconductor layer; and a second-conductivity-type semiconductor layer arranged on the light emitting layer, the second-conductivity-type semiconductor layer including an etch barrier layer.

In another aspect of the present invention, a light emitting device having a vertical topology comprises: a first-conductivity-type semiconductor layer; a light emitting layer arranged over the first-conductivity-type semiconductor layer; a second-conductivity-type semiconductor layer arranged on the light emitting layer, a nitride semiconductor layer arranged on the second-conductivity-type semiconductor layer, the nitride semiconductor layer having an energy band gap larger than an energy band gap of the seconds conductivity-type semiconductor layer; and a light extraction structure arranged on the nitride semiconductor layer.

In another aspect of the present invention, a light emitting device having a vertical topology comprises: a first-conductivity-type semiconductor layer; a light emitting layer arranged over the first-conductivity-type semiconductor layer; a second-conductivity-type semiconductor layer arranged on the light emitting layer, the second-conductivity-type semiconductor layer including a light extraction structure formed at outer surface of the second-conductivity-type semiconductor layer; and a nitride semiconductor layer interposed in the second-conduction-type semiconductor layer, the nitride semiconductor layer having an energy band gap larger than an energy band gap of the second-conductivity-type semiconductor layer and comprising at least one layer.

In still another aspect of the present invention, a method for manufacturing a light emitting device having a vertical topology comprises: forming a first-conductivity-type semiconductor layer over a substrate; forming, over the first-conductivity-type semiconductor layer, an etch barrier layer including at least one nitride semiconductor layer having an energy band gap larger than an energy band gap of the first-conductivity-type semiconductor layer; forming another first-conductivity-type semiconductor layer over the etch barrier layer; forming a light emitting layer over the first-conductivity-type semiconductor layer; forming a second-conductivity-type semiconductor layer over the light emitting layer; removing the substrate; and etching a surface of the first-conductivity-type semiconductor layer exposed after the removal of the substrate, thereby forming a light extraction structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
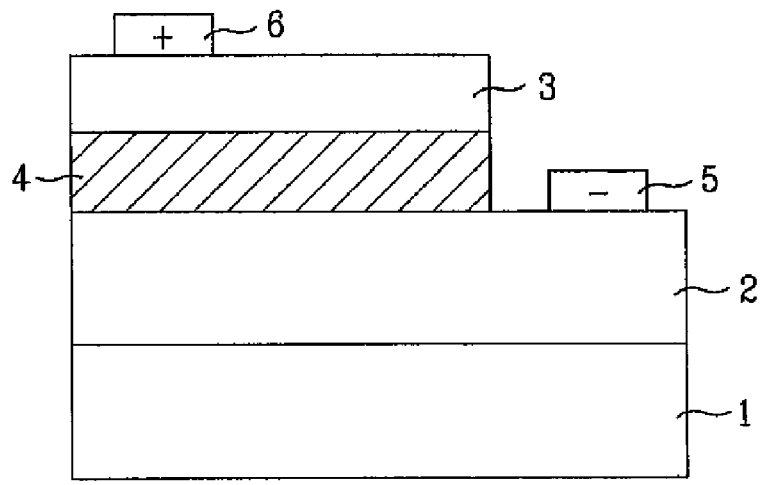
FIG. 1 is a sectional view illustrating an example of a conventional light emitting device having a horizontal topology.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther from the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Preferred embodiments of the present invention will be described, for example, with reference to a gallium nitride (GaN)-based light emitting diode (LED) formed on a non-conductive substrate such as a sapphire ($Al_2O_3$)-based substrate. However, the present invention is not limited to such a structure.

The embodiments of the present invention may employ other kinds of substrates including a conductive substrate. Therefore, the embodiments of the present invention may include AlGaInP diodes on a GaP substrate, CaN diodes on a SiC substrate, SiC diodes on a sapphire substrate, and/or any combination of nitride-based diodes on GaN, SiC, AlN, ZnO and/or other substrates. Further, in the present invention, use of an active layer region is not limited to diode regions. In addition, other forms of the active layer region may be employed in compliance with some embodiments of the present invention.

Meanwhile, the reason why it is difficult to grow a GaN-based semiconductor, as compared to other III-V ground compound semiconductors, is that, for example, there is no high-quality substrate such as a wafer made of GaN, InN, AlN, or the like.

For this reason, the GaN-based semiconductor is grown over a substrate made of a material different from that of the above-mentioned substrate, for example, sapphire. In this case, however, a large amount of defects are generated. Such defects have severe influence on the performance of the light emitting device.

The basic structure of the light emitting device, which is made of the GaN-based material, is illustrated in FIG. 1. As shown in FIG. 1, in the light emitting device, a light emitting layer 4 having a quantum well structure is arranged between an n-type semiconductor layer 2 and a p-type semiconductor layer 3 on a substrate made of a material different from the GaN-based material (hereinafter, referred to as a "heterogeneous substrate").

The p-type semiconductor layer 3 and light emitting layer 4 are partially etched such that the n-type semiconductor layer 2 is exposed. An n-type electrode 5 and a p-type electrode 6 are formed on the exposed n-type semiconductor layer 2 and p-type semiconductor layer 3, respectively.

However, the above-mentioned basic structure of the light emitting device has the following inevitable problems.

First, a reduction in light emission area occurs because a portion of the light emitting layer 4 is etched. Second, it is impossible to inject current such that the current is effectively and uniformly distributed, due to a low hole concentration and a low hole mobility in the p-type semiconductor layer 3. Third, heat generated during the operation of the device cannot be effectively released because of the thermal conductivity of the heterogeneous substrate 1.

Figure 2:
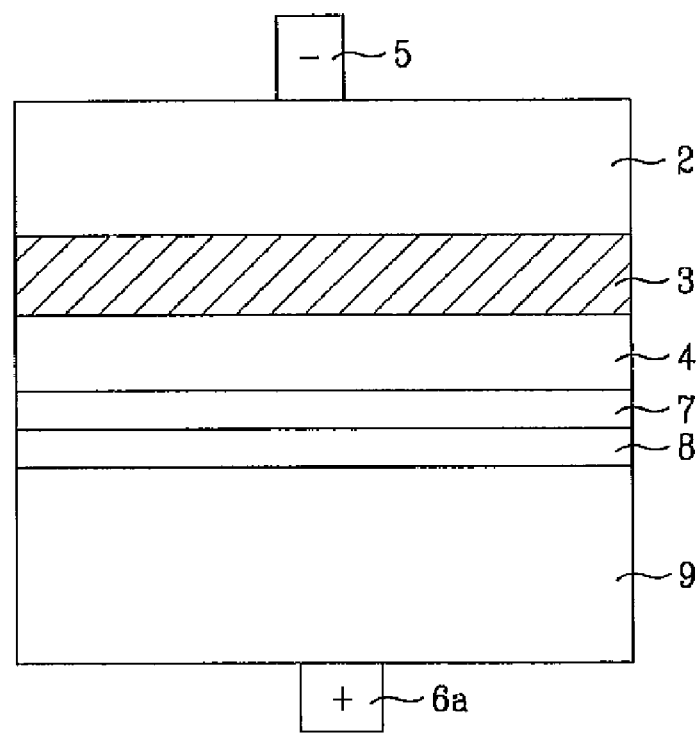
FIG. 2 is a sectional view illustrating an example of a conventional light emitting device having a vertical topology.
Figure 3:
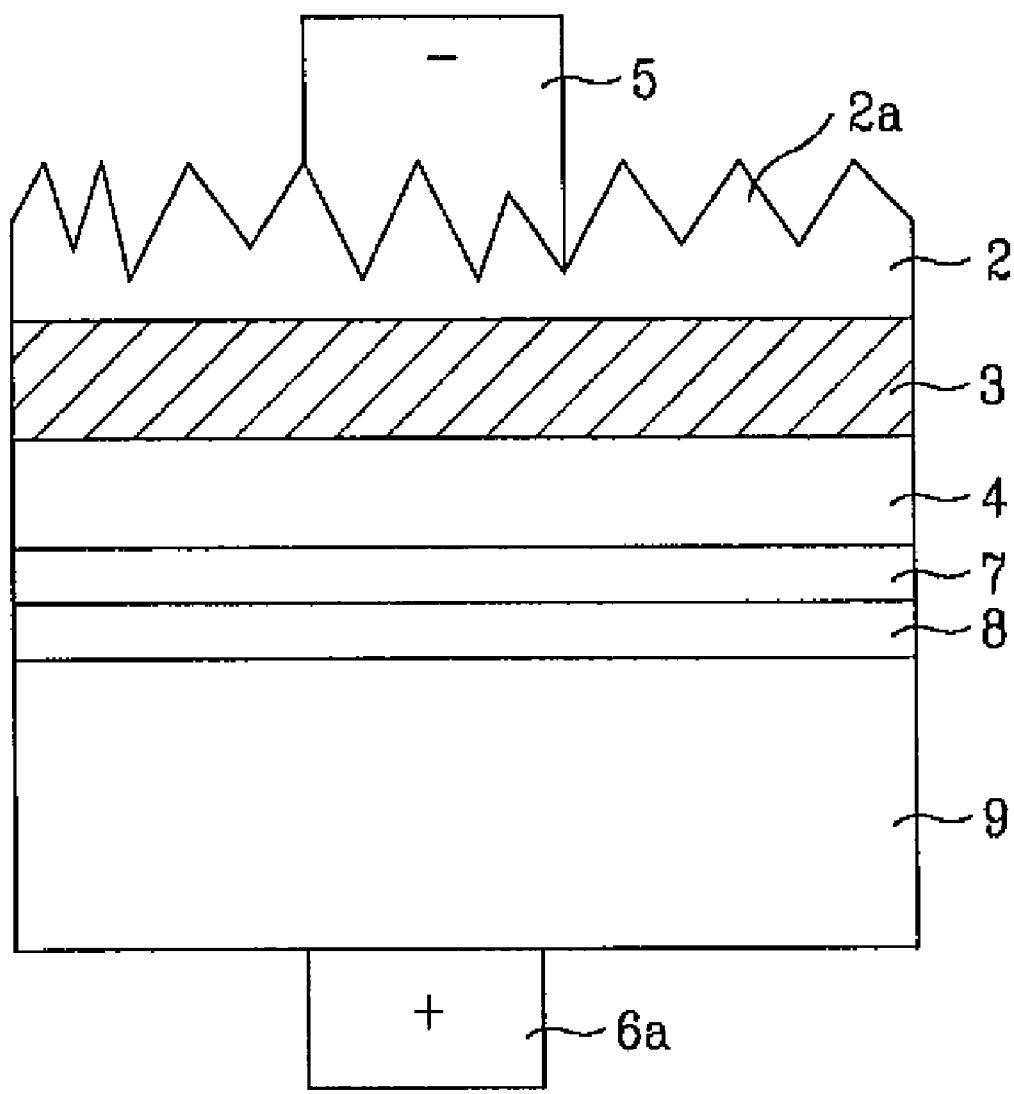
FIG. 3 is a sectional view illustrating an example of a vertical-topology light emitting device having a conventional light emission structure.

In order to overcome the above-mentioned problems, a light emitting device having a vertical topology as shown in FIG. 2 has been proposed.

In the vertical-topology light emitting device, a light emitting layer 4 is arranged between an n-type semiconductor layer 2 and a p-type semiconductor layer 3. An ohmic electrode 7, a reflective layer 8, and a support layer 9 are sequentially arranged, in this order, over the p-type semiconductor layer 3. Thereafter, a substrate, on which the above-mentioned structure has been formed, is separated from the structure. Subsequently, an n-type electrode 5 is formed on the n-type semiconductor layer 2 exposed after the separation of the substrate. At this time, a metal pad 6a may be formed on the support layer 9.

Since the n-type semiconductor layer 2 is exposed in accordance with the separation of the substrate, and the n-type electrode 5 is formed on the exposed surface of the n-type semiconductor layer 2, in the above-mentioned vertical-topology light emitting device, there is no reduction in light emission area. In addition, there is no problem caused by the substrate because the substrate is removed.

In the structure of such a vertical-topology light emitting device, generally, the surface shape of the n-type semiconductor layer 2 is controlled to achieve an enhancement in light emission efficiency.

In a conventional method for controlling such a surface shape, ultraviolet rays are irradiated onto the device under the condition in which the device is dipped in a chemical etching solution, to wet-etch the device. This method is called "photo-electrochemical (PEC) etching".

However, when a nitride semiconductor light emitting device, which has a vertical topology, is implemented using such a conventional PEC etching method, the following phenomenon may occur.

That is, when the surface layer of the device, namely, the n-type semiconductor layer 2, is chemically etched, the resultant surface shape is very non-uniform. In detail, conical or pyramid-shaped protrusions 2a having non-uniform heights or shapes are non-uniformly distributed.

Such non-uniform surface chemical etching characteristics cause non-uniform characteristics of current injection carried out for the operation of the device, thereby causing a degradation in the reliability of the device and a non-uniformity in the performance of the device. As a result, a reduction in productivity occurs.

Hereinafter, embodiments of the present invention capable of eliminating drawbacks incurred in such a vertical-topology light emitting device will be described.

Figure 4:
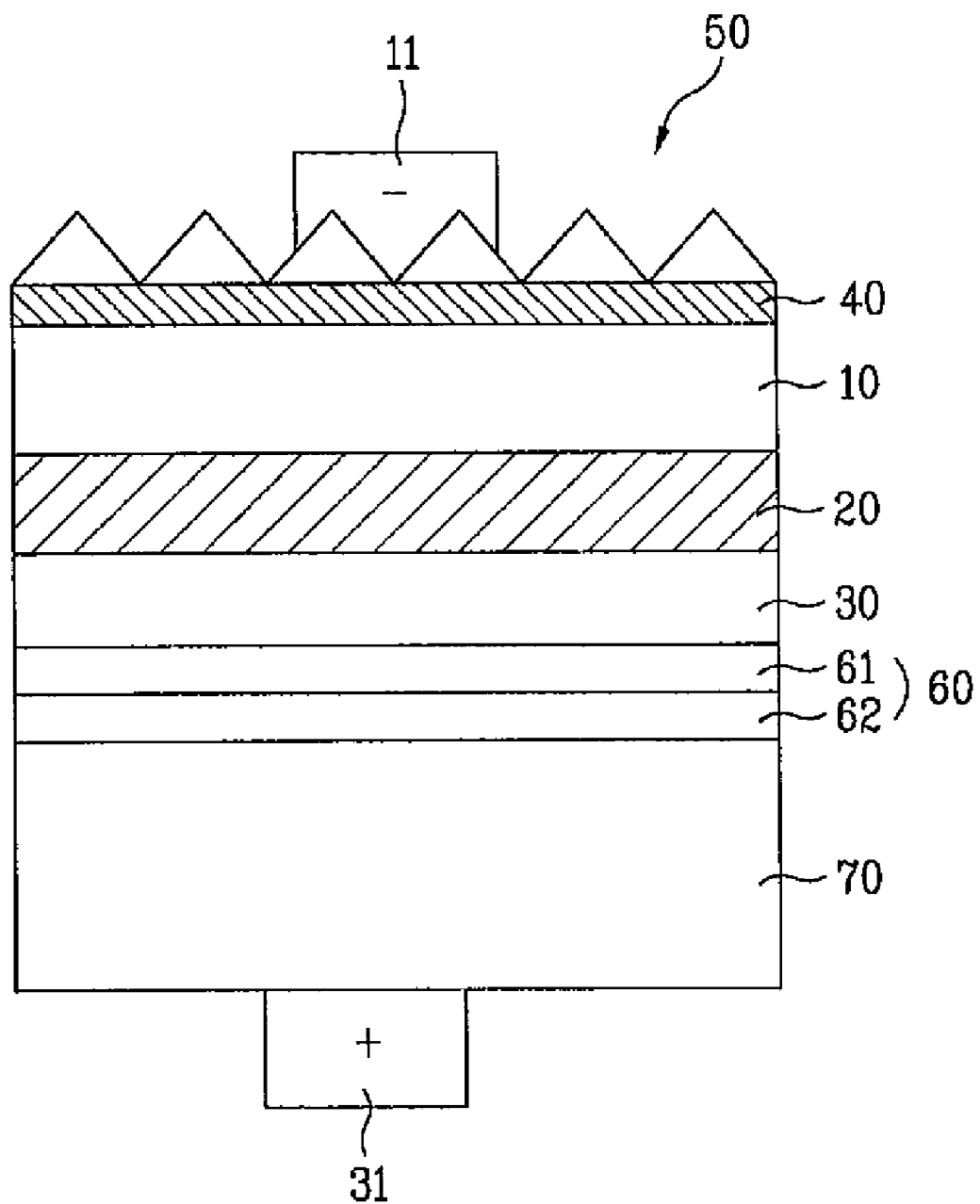
FIG. 4 is a sectional view illustrating an example of a light emitting device having a vertical topology according to the present invention.
Figure 5:
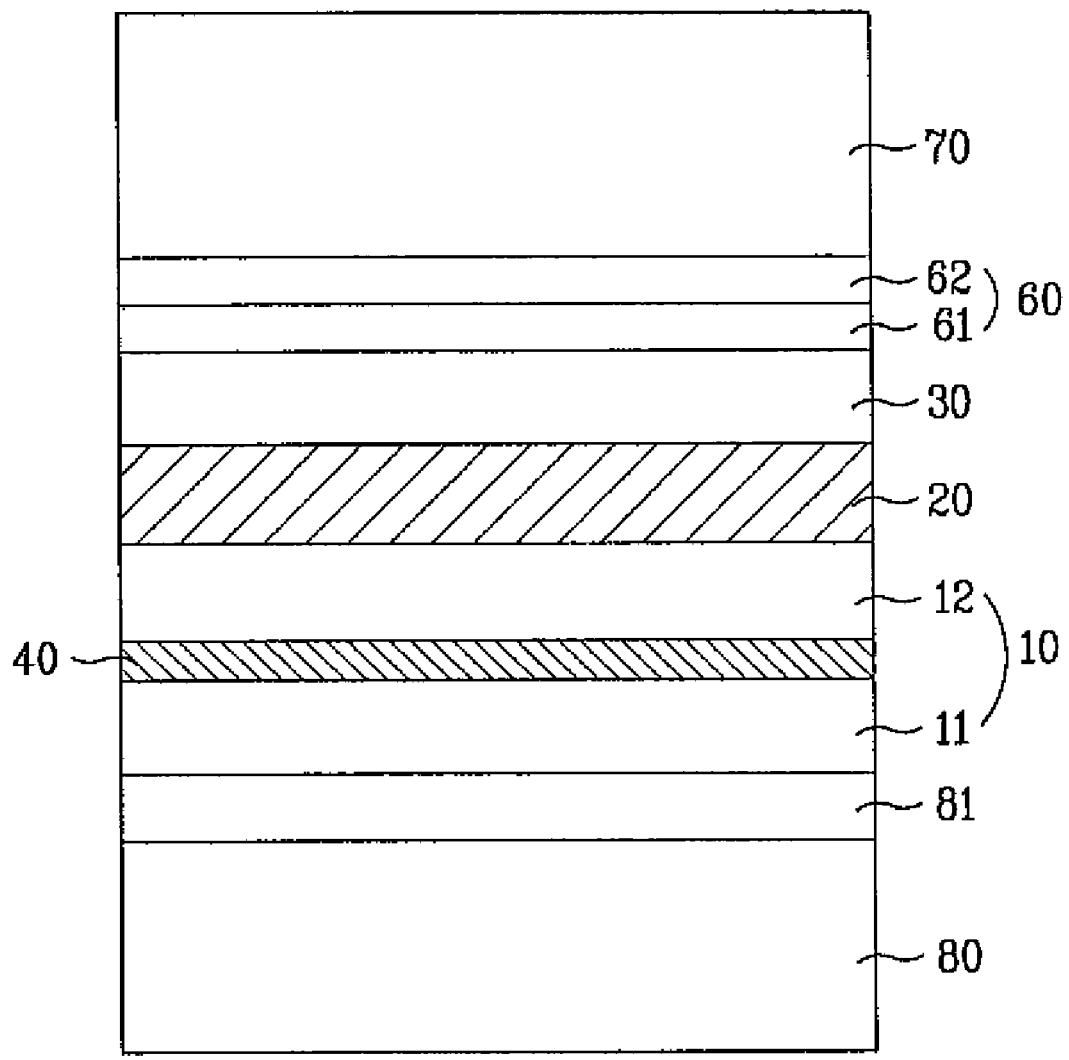
FIG. 5 is a sectional view illustrating a procedure for manufacturing the vertical-topology light emitting device according to the present invention.

Referring to FIG. 4, the basic structure of a nitride semiconductor light emitting device, according to an embodiment of the present invention, which has a vertical topology, is illustrated. The light emitting device includes an n-type nitride semiconductor layer 10, a nitride quantum well light emitting layer 20, and a p-type nitride semiconductor layer 30.

An etch barrier layer 40, which functions as an etch stop in a chemical etching process, is formed over the n-type nitride semiconductor layer 10. In a PEC process, accordingly, it is possible to achieve effective and uniform control of an etch depth.

Basically, in the nitride semiconductor vertical topology light emitting device, the surface of the n-type nitride semiconductor layer 10 is controlled to achieve an enhancement in light extraction efficiency. Thus, a light extraction structure 50 is formed. The above-mentioned PEC process is used to form the light extraction structure 50 by performing a chemical wet etching while irradiating ultraviolet rays onto the surface of the n-type nitride semiconductor layer 10.

The etch barrier layer 40 causes the chemical etching for the formation of the light extraction structure 50 to be stopped at a certain depth in the n-type nitride semiconductor layer 10. Thus, the etch barrier layer 40 controls the chemical etching such that the n-type nitride semiconductor layer 10 is uniformly etched to a certain depth from the surface of the n-type nitride semiconductor layer 10.

That is, the etching is begun from an outer surface of the n-type nitride semiconductor layer 10, to form the light extraction structure 50, and is then stopped at a position where the etch barrier layer 40 is disposed. Thus, the light extraction structure 50 is formed to have a depth from the outer surface of the n-type nitride semiconductor layer 10 to the etch barrier layer 40.

The etch barrier layer 40 exhibits an energy band gap larger than the energy band gap of the layer arranged over the etch barrier layer 40, namely, the surface of the n-type nitride semiconductor layer 10, for which an etching process is to be carried out.

The etch barrier layer 40 also has characteristics in that the energy band gap of the etch barrier layer 40 is larger than the photon energy of ultraviolet rays used in the PEC process. For the material of the etch barrier layer 40, an aluminum indium gallium nitride ($Al_x InGa_{1-x-y}N$: $0 \leq x$, $y \leq 1$) may be used.

For the n-type nitride semiconductor layer 10 or p-type nitride semiconductor layer 30, a gallium nitride (GaN) may be used. In particular, for the p-type nitride semiconductor layer 30, an aluminum indium gallium nitride ($Al_x InGa_{1-x-y}N$: $0 \leq V$, $w \leq 1$) may be used.

The above-described basic structure of the vertical-topology light emitting device may be formed over a first electrode 60 or may be formed over a support layer 70 when the support layer 70 is used. The first electrode 60 may comprise an ohmic electrode 61 and a reflective electrode 62. The ohmic electrode 61 and reflective electrode 62 may be formed on the same layer.

For the support layer 70, a metal substrate or a conductive semiconductor substrate may be used.

In this case, an n-type metal pad may be formed on the light extraction structure 50. The n-type metal pad is designated by reference numeral 11. Also, a p-type metal pad 31 may be formed on an outer surface of the support layer 70.

Hereinafter, the procedure for manufacturing the above-described vertical topology light emitting device will be described.

First, the n-type nitride semiconductor layer 10 is formed over a substrate 80 such that the etch barrier layer 40 is arranged in the n-type nitride semiconductor layer 10. That is, an n-type nitride semiconductor layer 11 having a certain thickness, the etch barrier layer 40, and an n-type nitride semiconductor layer 12 are sequentially formed over the substrate 80, in this order.

The etch barrier layer 40 may have a thickness of several nm. Preferably, the etch barrier layer 40 has a thickness of 1 nm to 1 μm.

For the material of the n-type nitride semiconductor layer 10, an n-type gallium nitride (n-GaN) may be used. For the material of the etch barrier layer 40, an aluminum gallium nitride (n-AlGaN) may be used.

Where a heterogeneous substrate is used for the substrate 80, an undoped buffer layer 81 may be interposed between the substrate 80 and the n-type nitride semiconductor layer 10.

The initial surface layer, namely, the n-type nitride semiconductor layer 11, is a layer on which the light extraction structure (designated by reference numeral 50 in FIG. 4) will be formed. Accordingly, it is preferred that the n-type nitride semiconductor layer 11 be formed to a thickness suitable for the formation of the light extraction structure 50.

Thereafter, the nitride quantum well light emitting layer 20 and p-type nitride semiconductor layer 30 are sequentially formed over the n-type nitride semiconductor layer 10. The first electrode 60 is then formed over the p-type semiconductor layer 30.

The support layer 70 is formed over the first electrode 60. The support layer 70 functions to support the structure of the light emitting device upon removal of the substrate 80 for the formation of a structure having a vertical topology.

Thereafter, the substrate 80 is removed in accordance with laser irradiation, chemical etching or a physical method. The n-type nitride semiconductor layer 10 exposed in accordance with the removal of the substrate 80 is then etched, for the formation of the light extraction structure 50.

Figure 6:
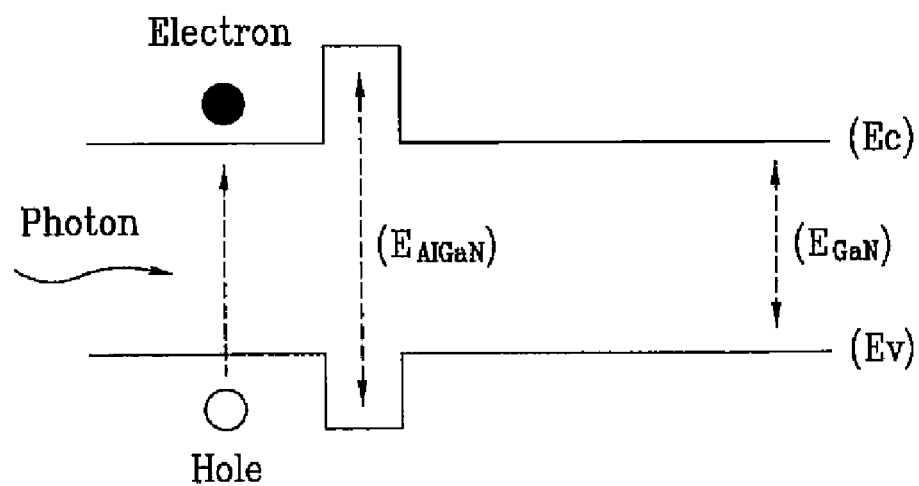
FIG. 6 is an energy band diagram of an embodiment of the present invention.

The energy band gap of the n-type nitride semiconductor layer 10 is smaller than that of the etch barrier layer 40, namely, the n-type aluminum gallium nitride (AlGaN) layer, as shown in FIG. 6.

In the etching process, PEC etching is carried out. That is, wet etching is carried out while irradiating ultraviolet rays. For the ultraviolet rays for the PEC etching of the nitride semiconductor, ultraviolet rays capable of supplying photons having energy larger than the band gap energy of the n-type nitride semiconductor layer 10 are used.

Accordingly, photons supplied by the ultraviolet rays effectively excite electrons in the n-type nitride semiconductor layer 10 to jump a band gap EGaN, namely, from a valence band Ev to a conduction band Ec. In this case, holes are generated in the band gap EGaN. The holes function as a minority charge in the n-type nitride semiconductor layer 10.

In accordance with such a hole generation, oxidation is promoted during the chemical etching.

Accordingly, the wet etching rate of gallium nitride (GaN) increases. The etching progresses continuously from the surface of the n-type nitride semiconductor layer 10 until it reaches the etch barrier layer 40, in accordance with the assistance of the ultraviolet rays.

Since the band gap energy $E_{AlGaN}$ of the etch barrier layer 40 is larger than the energy of the photons supplied by the ultraviolet rays, the ultraviolet rays cannot excite electrons in the valence band of the etch barrier layer 40, so that they cannot generate holes. As a result, the chemical etching progresses no longer, thus it is stopped.

The etch barrier layer 40 may have a multilayer structure.

Figure 7:
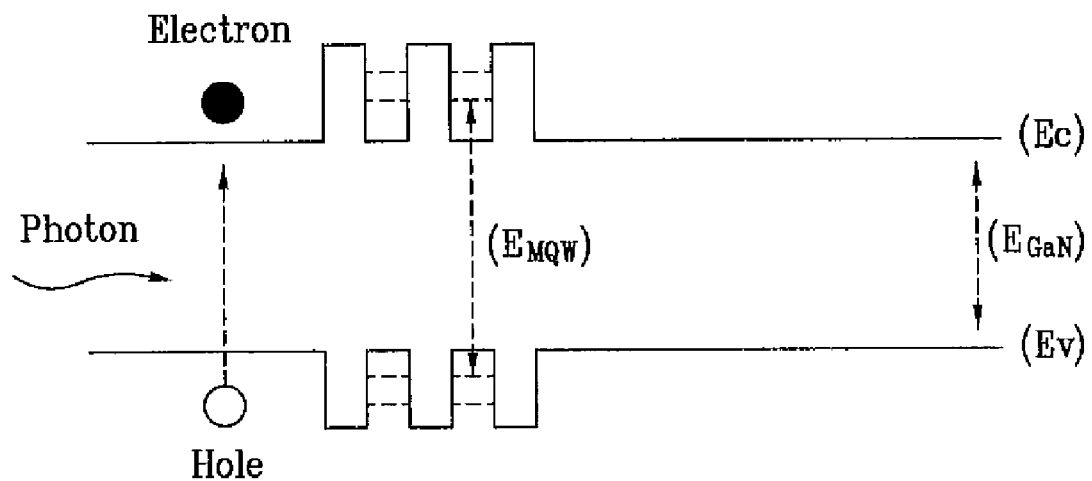
FIG. 7 is an energy band diagram of another embodiment of the present invention.

FIG. 7 is an energy band diagram of an example in which the etch barrier layer 40 has a multilayer structure. The multilayer etch barrier layer 40 is formed by alternately laminating two layers exhibiting different energy band gaps. In this case, the lamination is achieved such that one layer exhibiting a low energy band gap is interposed between two layers exhibiting a high energy band gap.

In particular, when the layer, which exhibits a low energy band gap, has an nm thickness, the multilayer etch barrier layer 40 exhibits a quantum confining effect. An example of the multilayer etch barrier layer 40, which has a structure of multiple quantum wells exhibiting a quantum confining effect, is illustrated in FIG. 7.

The multilayer etch barrier layer 40, which has a multiple quantum well structure, has a feature in that the quantum energy level $E_{MQW}$ determined by the quantum well structure is larger than the photon energy level of the ultraviolet rays used in the PEC etching.

Hereinafter, the above-described PEC etching procedure will be described in detail.

The principle of the PEC etching for a gallium nitride GaN can be expressed as follows:

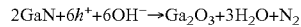

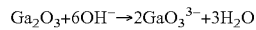

That is, when ultraviolet rays are irradiated onto a GaN surface, holes, which are minority carriers, are generated. The holes moves toward the GaN surface due to surface band bending. At this time, OH groups in an electrolyte reacts with GaN, thereby producing a $Ga_2O_3$ oxide.

The oxide reacts with $OH^-$ groups, so that it is dissolved in the form of $GaO_3^{3-}$ in the electrolyte. Thus, the oxide is removed. That is, the GaN semiconductor is wet etched in the electrolyte as it is subjected to oxidation/reduction processes. In this case, surplus holes are supplied in accordance with the irradiation of ultraviolet rays, so that the oxidation is promoted. Thus, a great increase in etching rate is achieved.

Figure 8:
FIGS. 8 to 11*b* are images showing a photo-electrochemical etching process according to the present invention.

During the above-described procedure, on the GaN surface, etching occurs in N-polar surface regions having a [000-1] index because the energy of these surface regions is unstable, as shown in FIG. 8. As a result, hexagonal pyramid surfaces having stable energy are formed.

Meanwhile, no or little etching occurs at [0001] Ga-polar surface regions on the GaN surface because these surface regions are stable. Accordingly, these surface regions are maintained in a soft state. However, when there are unstable defects, for example, dislocations, in the stable surface regions, the surface regions, which have such defects, are selectively etched.

Figure 9:
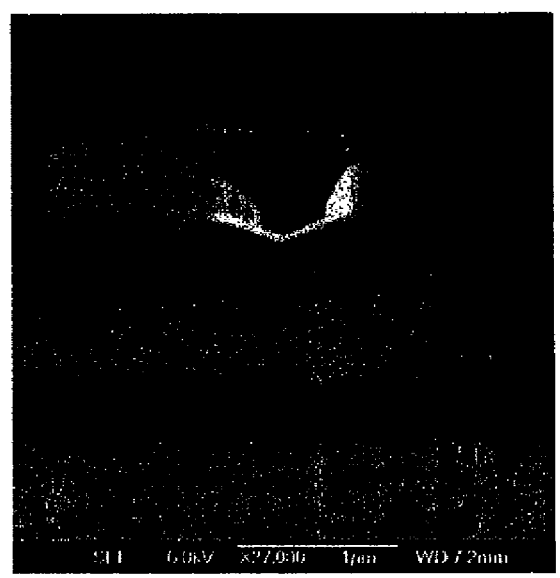

In this case, stable hexagonal pyramid surfaces are formed, similarly to the previous case, so that the resultant structure has a pin hole shape, as shown in FIG. 9.

Figure 10:
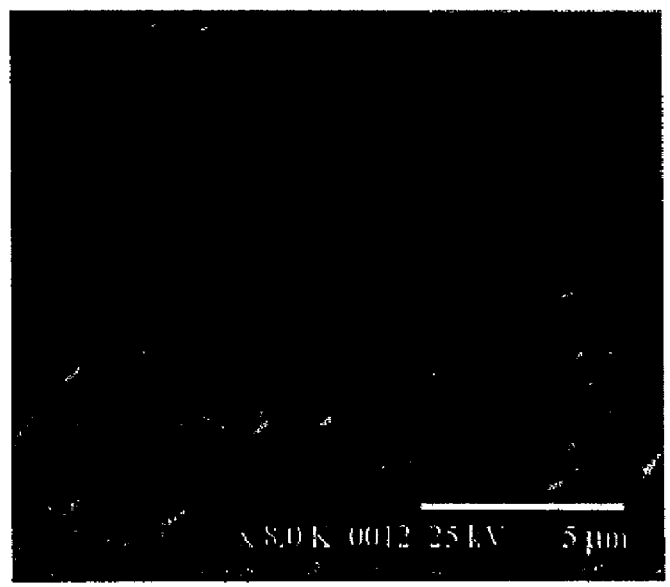

As described above, the [0001] Ga-polar surface regions of the GaN surface are etched while maintaining a soft surface shape, during the etching process, because they are stable. However, when there are unstable defects, for example, dislocations, in the stable surface regions, the defective surface regions exhibit an etching rate much smaller than those of other surface regions because they effectively compensate for surplus holes generated in accordance with the irradiation of ultraviolet rays. As a result, islands may be formed. Thus, the resultant surface is rough, as shown in FIG. 10.

Figure 11A:
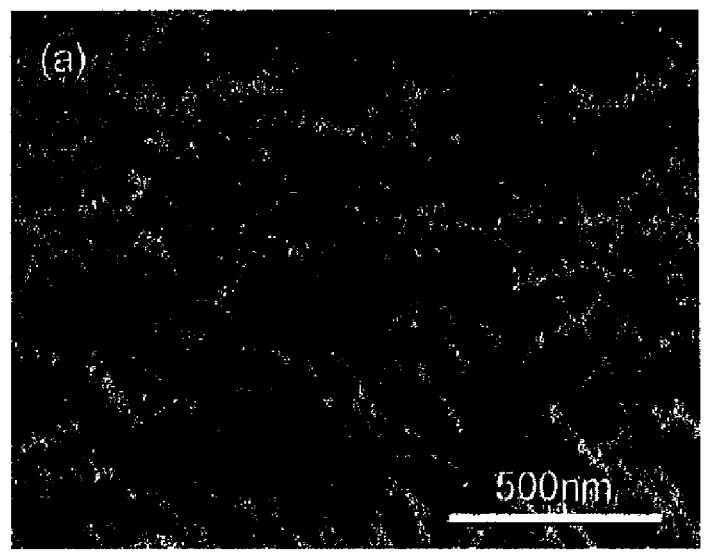
Figure 11B:
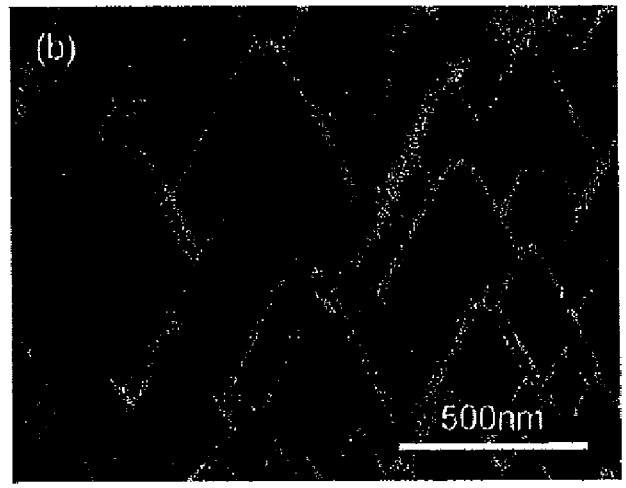
Figure 12:
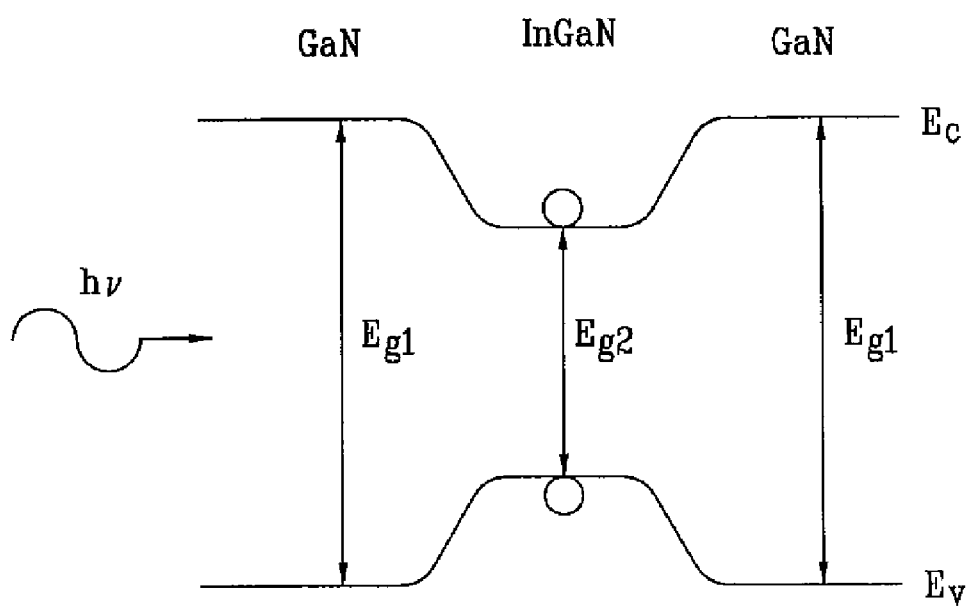
FIG. 12 is an energy band diagram showing band selectivity of the photo-electrochemical etching process.

FIGS. 11A and 11B show a state in which energy-stable hexagonal pyramid {10-1-1} surfaces are formed during an etching process because the energy of the [000-1] N-polar surface regions of the CaN surface is unstable. FIG. 11A corresponds to the case in which the etching process is carried out for 2 minutes. FIG. 11B corresponds to the case in which the etching process is carried out for 10 minutes.

In these cases, when ultraviolet rays are irradiated, the etching rate increases by about a second-order index or more, as compared to the case in which no ultraviolet ray irradiation is carried out.

When the energy of irradiated light is smaller than GaN, but larger than InGaN, the light generates holes in InGaN, while passing through CaN. As a result, GaN is not etched, but InGaN is selectively etched. Such phenomena are referred to as "band gap selectivity" of PEC etching.

Figure 13:
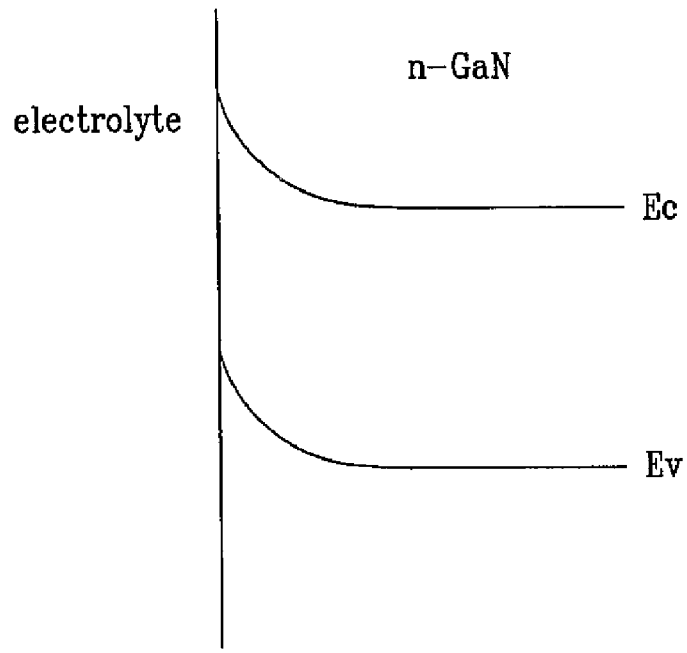
FIGS. 13 and 14 are diagrams showing a surface energy band structure depending on conductivity.

The rate of such PEC etching is maximized in an undoped state, and is high in p-type GaN, as compared to n-type GaN. This is caused by band bending occurring at the interface between the GaN and the electrolyte, as shown in FIGS. 13 and 14.

Figure 14:
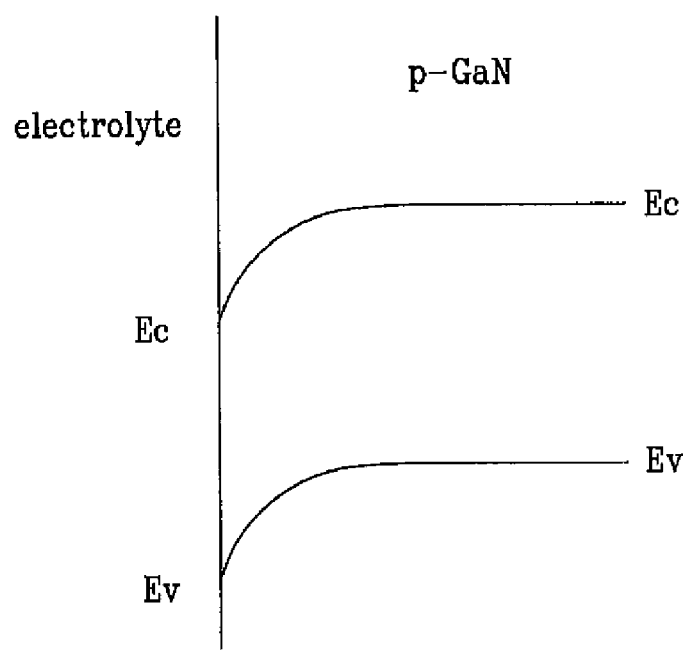

In the p-type GaN as shown in FIG. 14, holes move away from the surface due to band bending. On the other hand, in the n-type GaN as shown in FIG. 13, holes move toward the surface due to band bending. Such phenomena are referred to as "dopant selectivity".

In accordance with the present invention, it is possible to accurately control the etch depth during the etching of a GaN-based semiconductor layer, using the above-described principle. Accordingly, a uniform etch depth over the overall portion of the device surface can be secured. That is, it is possible to accurately control the etch depth by arranging an etch barrier layer at a position corresponding to a designed etch depth.

It is also possible to solve the problem of deep etching at certain regions and shallow etching at other regions caused by non-uniform distribution of crystal defects in a thin film, namely, non-uniformity in etch depth.

Thus, in the vertical-topology nitride semiconductor light emitting device, which includes the etch barrier layer 40 according to the present invention, current is injected into the light emitting layer during the operation of the device in a uniformly distributed state. Accordingly, an enhancement in light emission efficiency is achieved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device having a vertical topology, comprising:
    a first-conductivity-type semiconductor layer;
    a light emitting layer arranged over the first-conductivity-type semiconductor layer;
    a second-conductivity-type semiconductor layer arranged over the light emitting layer, the second-conductivity-type semiconductor layer comprising an etch barrier layer, the etch barrier layer comprising at least two layers; and
    a light extraction structure located over the etch barrier layer,
    wherein the at least two layers of the etch barrier layer alternate with a material of the second-conductivity-type semiconductor layer.

2. The light emitting device according to claim 1, wherein the light extraction structure comprises a pattern formed over the second-conductivity-type semiconductor layer.

3. The light emitting device according to claim 1, wherein the etch barrier layer comprises an $Al_xIn_yGa_{1-x-y}N$ layer ($0 \leq x, y \leq 1$).

4. The light emitting device according to claim 1, wherein the etch barrier layer has an energy band gap larger than an energy band gap of the second-conductivity-type semiconductor layer.

5. The light emitting device according to claim 1, wherein the etch barrier layer has a quantum well structure comprising a material having an energy band gap larger than an energy band gap of the second-conductivity-type semiconductor layer, and a material having an energy band gap equal to or smaller than the energy band gap of the second-conductivity-type semiconductor layer.

6. The light emitting device according to claim 1, wherein the second-conductivity-type semiconductor layer comprises an n-type semiconductor layer.

7. The light emitting device according to claim 1, wherein the first-conductivity-type semiconductor layer is arranged over a support layer or on a first electrode arranged over the support layer.

8. The light emitting device according to claim 7, wherein the first electrode comprises:
    a reflective electrode; and
    an ohmic electrode arranged on the reflective electrode.

9. The light emitting device according to claim 7, wherein the support layer comprises a metal substrate or a conductive semiconductor substrate.

10. A light emitting device having a vertical topology, comprising:
    a first-conductivity-type semiconductor layer;
    a light emitting layer arranged over the first-conductivity-type semiconductor layer;
    a second-conductivity-type semiconductor layer arranged over the light emitting layer;
    a light extraction structure over a surface of the second-conductivity-type semiconductor layer; and
    at least one nitride semiconductor layer between the second-conductivity-type semiconductor layer and the light extraction structure, the nitride semiconductor layer having an energy band gap larger than an energy band gap of the second-conductivity-type semiconductor layer,
    wherein at least a portion of the nitride semiconductor layer contacts the light extraction structure.

11. The light emitting device according to claim 10, wherein the light extraction structure has a depth extending from the surface of the second-conductivity-type semiconductor layer to the nitride semiconductor layer.

12. The light emitting device according to claim 10, wherein the nitride semiconductor layer comprises at least two layers alternating with a material of the second-conductivity-type semiconductor layer.

13. The light emitting device according to claim 10, wherein the nitride semiconductor layer has a quantum well structure comprising a material having an energy band gap larger than an energy band gap of the second-conductivity-type semiconductor layer, and a material having an energy band gap equal to or smaller than the energy band gap of the second-conductivity-type semiconductor layer.

14. The light emitting device according to claim 10, wherein the light extraction structure is formed in accordance with a photo-electrochemical etching process performed at the surface of the second-conductivity-type semiconductor layer.

15. The light emitting device according to claim 14, wherein the nitride semiconductor layer has an energy band gap larger than the photon energy of light used in the photo-electrochemical etching process.

16. The light emitting device according to claim 10, wherein the first-conductivity-type semiconductor layer is arranged over a support layer comprising a metal substrate or a conductive semiconductor substrate.

17. The light emitting device according to claim 10, wherein the light extraction structure is formed on the nitride semiconductor layer.

18. A light emitting device having a vertical topology, comprising:
    a first-conductivity-type semiconductor layer;
    a light emitting layer arranged over the first-conductivity-type semiconductor layer;

a second-conductivity-type semiconductor layer arranged on the light emitting layer, the second-conductivity-type semiconductor layer including a light extraction structure formed at outer surface of the second-conductivity-type semiconductor layer; and at least one nitride semiconductor layer interposed in the second-conduction-type semiconductor layer, the nitride semiconductor layer having an energy band gap larger than an energy band gap of the second-conductivity-type semiconductor layer, wherein the nitride semiconductor layer comprises at least two layers alternating with a material of the second-conductivity-type semiconductor layer.

* * * * *